WIDE-BAND AMPLIFIER

Filed Nov. 13, 1961

6 Sheets-Sheet 1

INVENTOR.
KARL HINRICHS
BY Samuel B. Stone
ATTORNEY

INVENTOR.
KARL HINRICHS
BY Samuel B. Stone
ATTORNEY

INVENTOR.
KARL HINRICHS
BY
Samuel B. Stone
ATTORNEY

INVENTOR.
KARL HINRICHS
BY *Samuel B. Stone*
ATTORNEY

INVENTOR.
KARL HINRICHS
BY Samuel B. Stone
ATTORNEY

March 15, 1966 K. HINRICHS 3,241,080

WIDE-BAND AMPLIFIER

Filed Nov. 13, 1961 6 Sheets-Sheet 6

*INVENTOR.*

KARL HINRICHS

*BY* Samuel B. Stone

ATTORNEY 3,241,080
Patented Mar. 15, 1966

3,241,080

WIDE-BAND AMPLIFIER

Karl Hinrichs, Fullerton, Calif., assignor to Beckman Instruments, Inc., a corporation of California
Filed Nov. 13, 1961, Ser. No. 151,604
14 Claims. (Cl. 330—10)

This invention relates to electrical signal amplifiers and more particularly to wide-band low pass amplifiers for the precision amplification of signals having a frequency range from zero (direct current) to a high frequency.

In the area of low level measurements it is necessary that amplifiers be highly accurate for level (linearity) and for frequency (gain-bandwidth), and be fast in operation while providing virtually complete conductive and electrostatic isolation between the input and the output of the amplifier. A high input impedance is necessary to avoid excessive loading of the input device, such as a transducer. The amplifier must settle fast in order to unload the input fast, and the amplifier must not kick current back into the input circuit.

Heretofore low frequency low pass amplifiers have been provided which amplify D.C. and very low frequency A.C. signals by utilizing carrier modulation. An amplifier of this nature is described in copending U.S. patent application Serial No. 823,796, entitled, "Potential Difference Transfer Device," and assigned to the assignee of the present invention. This copending application describes an ultralinear high accuracy amplifier for signals having a frequency range from direct current to a relatively low alternating current frequency, such as, 100 cycles per second. However, in many applications of such amplifiers the band-width and speed thereof is not sufficient. Band-pass amplifiers have been provided previously which provide high conductive and electrostatic isolation between the input and output thereof, but such amplifiers are not accurate at low frequencies because of their excessive droop. Reasonably wide-band low pass amplifiers have been provided, but such amplifiers have been characterized by poor accuracy and/or inadequate isolation.

According to a feature of the present invention a precision data amplifier is provided which will amplify signals of a wide frequency range while also providing the required high accuracy, isolation of the input from the output thereof, high common-mode rejection, etc.

An additional feature of the present invention is in the provision of a wide-band low pass amplifier having excellent linearity.

A further feature of the present invention is in the provision of a wide-band low pass amplifier having precise gain as a function of the frequency.

Another feature of the present invention is the provision of a wide-band low pass amplifier having precise gain for level and for a wide span of frequencies, including direct current.

A further feature of the present invention is in the provision of a wide-band amplifier having high accuracy and high linearity, and which utilizes transformers to isolate the input from the output thereof. Means are provided to adjust gain and to compensate for transformer errors.

According to another feature of the present invention, an amplifier is provided which has a slow signal path and a fast signal path between the input and the output thereof, and which has a slow signal feedback path and at least one fast signal feedback path while retaining complete conductive and electrostatic isolation between the input and the output thereof.

A wide-band amplifier is provided in accordance with the teachings of the present invention by providing forward and feedback channels each having paths for slow and fast signals. Input voltages are applied to the amplifier, and feedback voltages subtract from the input voltages to provide error voltages. The higher frequency components of the error voltage are applied through a transformer to a mixer amplifier by fast transmission means. The lower frequency (including direct current) components are modulated, transferred through a transformer and suitable transmission means, demodulated and applied to the mixer amplifier. Feedback signals are transmitted to the input circuit of the wideband amplifier from the output of the mixer amplifier, the higher frequency feedback components being transferred through one or more transformers to the input circuit while the lower frequency components of the feedback signals are modulated, passed through a transformer, demodulated and applied to the input circuit. The feedback channel is crossed-over serially. Gain adjusting and trimming impedances are provided in the feedback channel. Impedances may be provided to compensate for transformer errors in the feedback path.

Other features and objects of the invention will be better understood from a consideration of the following detailed description when read in conjunction with the attached drawings in which.

Figure 1:
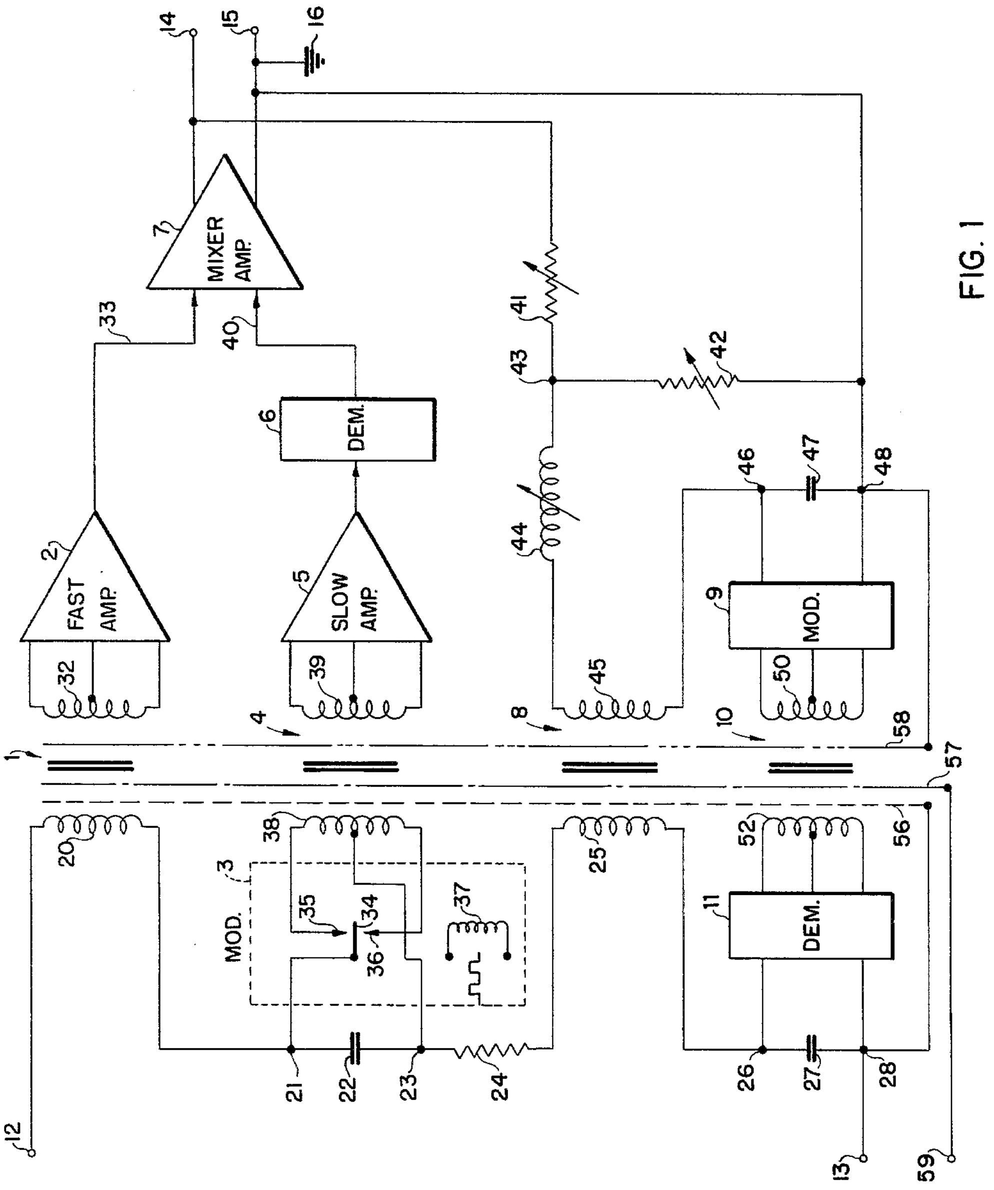
FIG. 1 is a combined block and schematic diagram of a low level wide-band amplifier constructed in accordance with the teachings of the present invention.

FIG. 1 illustrates a wide-band amplifier having a forward channel including a fast signal path and a slow signal path. The fast signal path includes a transformer 1 and a fast amplifier 2, whereas the slow signal path includes a modulator 3, a transformer 4, a slow amplifier 5 and a forward demodulator 6. The outputs from the fast and slow signal paths are applied to the input of a mixer amplifier 7. According to a feature of this invention, the wide-band amplifier has a serially crossed-over feedback channel which includes fast and slow feedback paths. This arrangement provides high accuracy. The feedback fast path includes a transformer 8, and the feedback slow path includes a modulator 9, a transformer 10 and a demodulator 11. Input voltage signals are applied to input terminals 12 and 13, and the feedback voltage signals are subtracted from the input voltage signals to provide error voltage signals. The error voltage signals are amplified by the forward channel. Output signals from the wide-band amplifier are derived from terminals 14 and 15 which are connected with the output of the mixer amplifier 7. The terms slow path and slow amplifier are used to designate paths and amplifiers for transferring signals of low frequency, such as, zero to a few cycles per second. The terms fast path and fast amplifier designate paths and amplifiers used to transfer signals of a higher frequency, such as, a few cycles per second to above one hundred thousand cycles per second.

Considering FIG. 1 in more detail, the input terminal 12 is connected to an upper terminal of a primary winding 20 of the transformer 1. The lower terminal of the primary winding 20 is connected to an input terminal 21 of the modulator 3, and through a capacitor 22 to a second input terminal 23 of the modulator 3. An overload limiting resistance 24 may be connected from the terminal 23 to the upper terminal of a primary winding 25 of the transformer 8. The lower terminal of the primary winding 25 is connected to an output terminal 26 of the demodulator 11, and through a capacitor 27 to a second output terminal 28 of the demodulator 11. The output terminal 28 of the demodulator 11 is connected with the input terminal 13. A secondary winding 32 of the transformer 1 is connected to the input of the fast amplifier 2 which amplifies the fast error signals. The output of the fast amplifier 2 is connected through a line 33 to an input of the mixer amplifier 7.

The modulator 3 modulates the slow error signals, and it may be a conventional chopper which includes a vibrating contact arm 34, and fixed contacts 35 and 36. A winding 37 controls the vibratory movement of the arm 34. The output of the modulator 3 is connected to a primary winding 38 of the transformer 4. A secondary winding 39 of the transformer 4 is connected to the input of the slow amplifier 5. The output of the slow amplifier 5 is connected to the input of the demodulator 6 which demodulates the modulated and amplified slow error signals. The output of the demodulator 6 is connected through a line 40 to a second input of the mixer amplifier 7. The outputs of the mixer amplifier 7 are connected to output terminals 14 and 15. The output terminal 15 is connected to ground indicated by reference numeral 16.

The output of the mixer amplifier 7 is connected across a divider which includes variable resistances 41 and 42. This divider serves to accurately adjust the D.C. gain. A trimming inductance 44 may be connected from a terminal 43 at the junction of the resistances 41 and 42 to the upper terminal of a primary winding 45 of the transformer 8. The lower terminal of the primary winding 45 is connected to a first input terminal 46 of the modulator 9, and through a capacitor 47 to a second input terminal 48 of the modulator 9. The input terminal 48 is connected to the resistance 42 and the output terminal 15 of the mixer amplifier 7. The modulator 9 may be a chopper similar in construction to the modulator 3. The output of the modulator 9 is connected to a primary winding 50 of the transformer 10. A secondary winding 52 of the transformer 10 is connected to the input of the demodulator 11. The demodulator 11 also may be a chopper similar to that utilized as the modulator 3. The output of the demodulator 11 is connected to the terminals 26 and 28.

As noted above, the lower output of the mixer amplifier 7 is grounded at the output terminal 15. Although not shown for simplicity of illustration, the fast amplifier 2, the slow amplifier 5 and the demodulator 6 are connected to this ground terminal. No portion of the input circuit is connected to this ground terminal thereby to provide a floating input which is conductively and electrostatically isolated from the output of the wide-band amplifier.

The transformers 1, 4, 8 and 10 may be shielded in the manner shown. Each of the transformers may include a shield 56, a shield 57 and a shield 58. The shields 56, which may be termed inner floating guard shields, of each transformer are connected together and to the terminal 28. The shields 57, which may be termed transducer guard shields, are connected together and to an input terminal 59. The input terminal 59 normally is connected to the shield of a transducer, the signal terminals of which are connected to input terminals 12 and 13 of the wide-band amplifier. The shield of the transducer normally is connected to transducer local ground. The shields 58, which may be termed system central ground shields or mecca shields, are tied together and connected to the terminal 48 and, consequently, to ground at 16.

In the operation of the wide-band amplifier illustrated in FIG. 1, a transducer, such as a thermocouple, a strain gauge, a thermistor, or the like, is connected to input terminals 12 and 13, normally through a length of two-conductor shielded cable. The shield of the transducer normally is connected to the input terminal 59. The feedback voltage signals subtract from the input transducer voltage signals to provide error voltage signals. The error voltage signals from zero (direct current) to approximately five cycles per second are modulated by the modulator 3 and applied through the transformer 4 to the slow amplifier 5. The output signals from the slow amplifier 5 are demodulated by the demodulator 6 and applied to the input of the mixer 7. The higher frequency error voltage signals in the range of approximately five cycles per second up to above 100,000 cycles per second (and may be as high as megacycles depending upon the use of precision components and transformers) are applied through the transformer 1 to the fast amplifier 2. The output of the fast amplifier 2 is applied to an input of the mixer amplifier 7. It is to be noted that although a series forward channel is discussed and described, a parallel arrangement of the forward paths may be utilized if desired without affecting the accuracy of the present wide-band low pass amplifier. The amplifiers 2 and 5 in FIG. 1 may be omitted, but they do provide a higher input impedance and aid in reducing errors. The feedback channel will correct errors appearing in the forward channel or loop. Although specific crossover frequencies for the forward and feedback channels are discussed and described in connection with the embodiments of the present invention, the roll-off is not necessarily sharp. For example, a slow path may transfer signals from zero to thousands of cycles but the upper roll-off may begin at a few cycles per second. The lower roll-off of the higher frequency path is accomplished in a similar manner so that for discussion the cross-over may be discussed as a particular frequency whereas it actually occurs over a range of frequencies.

In the operation of the modulator 3, a square wave signal is applied to the winding 37 to operate the vibratory arm 34. The frequency of operation may be 400 cycles per second, for example. When there is a voltage difference between the input terminals 21 and 23 of the modulator 3, current will flow alternately in an opposite sense in the primary winding 38 of the transformer 4. No current will result when the potential difference between the terminals 21 and 23 is zero which occurs, of course, when no low frequency error signals are present since the capacitor 22 serves to by-pass the higher frequency signals. The frequency of operation of the modulator 3 is synchronized in drive frequency and phase with the demodulator 6. The demodulator 6 also may be a chopper or it may be a solid state device and its structure and operation will be discussed in greater detail subsequently. However, the modulator 3 and the demodulator 6 are synchronized in operation by applying a signal of the same frequency and controlled phase to each.

All or a portion of the output voltage appearing at the output terminals 14 and 15 is fed back to the input circuit in inverse relation. The band width of the forward channel is different from the band width of the feedback channel to provide a stable roll-off of the loop gain to thereby prevent undesired oscillations. The voltage signals from the terminals 14 and 15 are applied to the potential divider comprising the variable resistances 41 and 42. The relative values of the resistances 41 and 42 may be varied to set the over-all D.C. gain of the wide-band amplifier. Hence, a portion of the output voltage appearing across the terminals 14 and 15 is applied to the series combination of the primary 45 of the transformer 8 and the input of the modulator 9. The transformer 8 passes the higher frequency, or fast, feedback voltages back to the input circuit by means of the secondary 25 of the transformer 8. These fast feedback voltages, for example, may have a range of a few cycles per second to many kilocycles per second. The lower frequency voltages, or the slow voltages, are modulated by the modulator 9 in the same manner as the low frequency error voltages are modulated by the modulator 3. The slow feedback voltages, for example, may have a range of zero to a few cycles per second. The modulated voltages appearing at the output of the modulator 9 are applied through the transformer 10 to the demodulator 11. The demodulator 11, which also may be a chopper constructed like the modulator 3, demodulates the slow feedback voltages and applies them to the input circuit of the wide-band amplifier at the output terminals 26 and 28 of the demodulator 11.

The transfer of the output potential (or precision portion thereof) from the terminals 14 and 15 to the input circuit by means of transformers whose primaries effectively are in series and whose secondaries effectively are in series provides a high accuracy transfer device over a very wide range of frequencies, including direct current. This is true because any chosen frequency component of the output of the amplifier 7 must be applied across at least one of these links or paths and is reconstituted on the secondary side in a similar form. Therefore, any variations or changes in the components in the feedback channel do not affect the accuracy of the over-all amplifier but merely affect the particular cross-over frequency which is relatively unimportant. In other words, the roll-off characteristics of each feedback path do not affect the accuracy of the over-all amplifier.

The variable inductance 44 is a trimming inductance which may be varied to affect the feedback, or loop, gain and thereby adjust the over-all A.C. gain of the wide-band amplifier. For example, an increase in the impedance 44 decreases the feedback gain and thereby increases the over-all gain of the wide-band amplifier. The capacitor 47 connected between the input terminals 46 and 48 of the modulator 9 serves to by-pass the higher frequency feedback voltages. Likewise, the capacitor 27 connected across the output terminals 26 and 28 of the demodulator 11 serves to pass the higher frequency error voltages.

The chopper modulator 3 and the chopper demodulator 11 may be in the same double-pole-double-throw enclosure. The same holds true for the demodulator 6 and the modulator 9 if choppers are utilized for these components. The choppers used are break-before-make type choppers to avoid shorting paths for the signals. If accuracy requirements permit, the modulator 9 and the demodulator 11 may be low level tube or solid-state circuits. These two units are synchronized in operation, but it is not necessary that they be synchronized with the modulator 3 and the demodulator 6, although it may be convenient to do so. Also, the modulator 9 and the demodulator 11 may be operated at a higher frequency than the modulator 3 and the demodulator 6 if desired.

Figure 2:
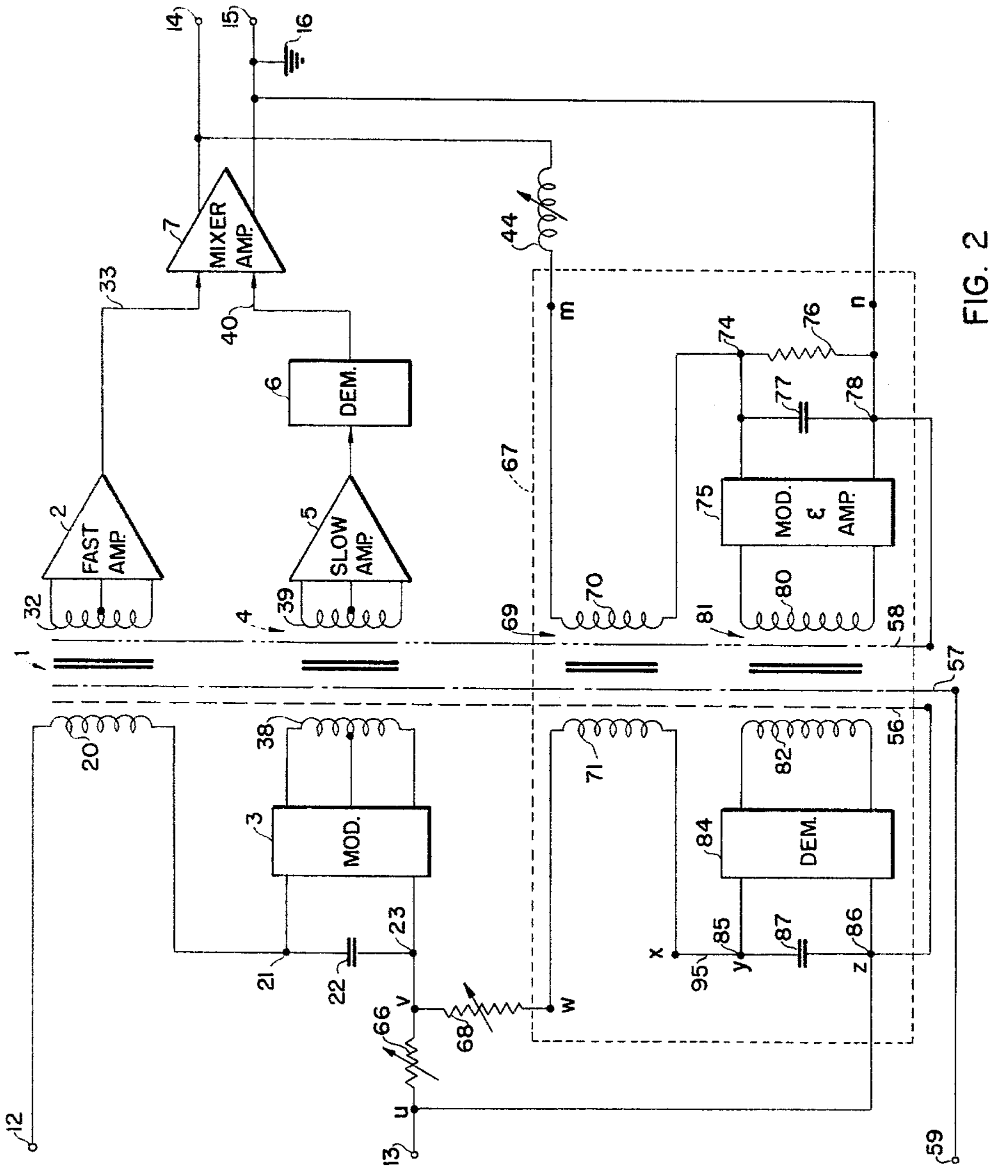
FIG. 2 illustrates in block and schematic form a high level wide-band amplifier in accordance with the present invention.

FIG. 2 illustrates another embodiment of a wide-band amplifier having high level feedback isolation constructed in accordance with the present invention. Certain of the components in the arrangement of FIG. 2 are the same as those in FIG. 1 and, therefore, like reference numerals are used to identify like components. The feedback channel including the feedback isolator and the feedback divider in the circuit in FIG. 2 differs from that illustrated in FIG. 1. The input terminal 12 of the wide-band amplifier is connected through the primary winding 20 of the transformer 1 to the upper terminal 21 of the modulator 3. The capacitor 22 is connected across the input terminals 21 and 23 of the modulator 3. The input terminal 13 is connected through a variable resistance 66 to the terminal 23. The feedback voltages are developed across the variable resistance 66 and subtract from the input voltages applied to the terminals 12 and 13 to provide error voltages. The modulator 3 is connected to the primary winding 38 of the transformer 4. The transformer 1 serves to pass the higher frequency error voltages through the fast amplifier 2 to the mixer amplifier 7, and the transformer 4 serves to pass the slow error voltages which have been modulated through the slow amplifier 5 to the demodulator 6. The demodulator 6 demodulates the slow error voltages and applies them to the mixer amplifier 7. The output of the mixer amplifier 7 is applied to the output terminals 14 and 15, the output terminal 15 being grounded at 16.

According to a feature of this invention, the feedback circuit for the wide-band amplifier includes serially crossed-over fast and slow feedback voltage paths. The output of the mixer amplifier 7 is applied through a variable trimming inductance 44 to a feedback isolator shown within dashed line box 67. The output of the feedback isolator 67 is connected across a variable resistance 68 and the variable resistance 66. These variable resistances 68 and 66 serve as a divider. The feedback isolator 67, which subsequently will be discussed in greater detail in connection with the description of FIG. 7, includes a transformer 69 having a primary winding 70 and a secondary winding 71. The primary winding 70 is connected from the variable inductance 44 to an input terminal 74 of a modulator and amplifier 75. A resistance 76 and a capacitance 77 are connected in parallel from the terminal 74 to a second input terminal 78 of the modulator and amplifier 75. The terminal 78 also is connected with the output terminal 15 of the wide-band amplifier. Hence, the output of the mixer amplifier 7 is connected across the primary winding 70 and the input of the modulator 75. The output of the modulator and amplifier 75 is connected to a primary 80 of a transformer 81. A secondary 82 of the transformer 81 is connected to a demodulator 84. An upper output terminal 85 of the demodulator 84 is connected through the secondary winding 71 of the transformer 69 to the variable resistance 68. A lower output terminal 86 of the demodulator 84 is connected to the input terminal 13. A capacitor 87 is connected across the terminals 85 and 86. The inner floating guard shields 56 of the transformers 1, 4, 69 and 81 are connected together and to the terminal 86. The transducer guard shields 57 are connected together and to the input terminal 59. The system central ground shields 58 are connected together and to the terminal 78.

In the operation of the wide-band amplifier shown in FIG. 2 a transducer is connected through a shielded cable across the terminals 12 and 13. The shield of the transducer normally is connected through the cable shield to the terminal 59. The feedback voltages developed across the variable resistance 66 subtract from the input transducer voltages thereby providing resultant error voltages. The higher frequency, or fast, error voltages are transferred through the transformer 1 and amplified by the fast amplifier 2. The amplified error voltages are applied from the output of the fast amplifier 2 to the input of the mixer amplifier 7. The capacitor 22 serves to prevent the fast error voltages in the input circuit from being applied to the modulator 3. The slow error voltages are modulated by the modulator 3 which may be constructed and operated like the modulator 3 shown in FIG. 1. The modulated slow voltages are transferred through the transformer 4 and amplified by the slow amplifier 5. The output of the slow amplifier 5 is applied to the demodulator 6 which serves to demodulate the modulated slow error voltages and apply the slow error voltages to the mixer amplifier 7.

The output of the mixer amplifier 7 is applied through the trimming inductance 44 to the series crossed-over feedback isolator 67. The transformer 69 in the feedback isolator 67 serves to pass the fast feedback voltages. The slow feedback voltages are modulated and amplified by the modulator and amplifier 75 and applied to the primary 80 of the transformer 81. The transformer 81 passes the modulated slow feedback voltages to the demodulator 84 which in turn demodulates these voltages. The fast and the slow feedback voltages are additively applied across the variable resistances 66 and 68 which serve as a potential divider. Hence, a portion of the feedback voltages is developed across the variable resistance 66 and is connected in opposition to the input transducer voltages applied to the input terminals 12 and 13. The capacitors 77 and 87 serve as by-pass impedances across the respective modulator and amplifier 75 and the demodulator 84 for the higher frequency, or fast, feedback voltages.

The modulator 3 and the demodulator 6 in FIG. 2 are synchronized in the same manner as discussed in connection with FIG. 1. Likewise, the modulator 75 and the demodulator 84 are synchronized, and they are operated at a higher frequency, for example, 28 kilocycles. The modulator 75 and the demodulator 84 usually are not synchronized with the modulator 3 and the demodulator 6. The demodulator 6, the modulator and amplifier 75 and the demodulator 84 preferably are solid-state devices. If desired, trimming resistors may be connected across the secondary 71 of the transformer 69 and across the output terminals 85 and 86 of the demodulator 84.

As discussed in connection with the wide-band amplifier shown in FIG. 1, the amplifiers 2 and 5 in FIG. 2 may be omitted, and/or the forward channel may include parallel paths instead of the series arrangement shown. The particular arrangement for the forward channel is not highly important since the feedback arrangement will correct errors appearing in the forward channel. Also, the roll-off in the forward and feedback channels is not sharp, and the roll-off characteristics of each feedback path do not affect the accuracy of the over-all amplifier. The forward channel has a band pass of above 100,000 cycles (and may be in the megacycles range depending upon the use of precision components and transformers). The upper frequency limit in the feedback channel normally is lower than the upper frequency limit in the forward channel to prevent oscillation as discussed previously.

Figure 3:
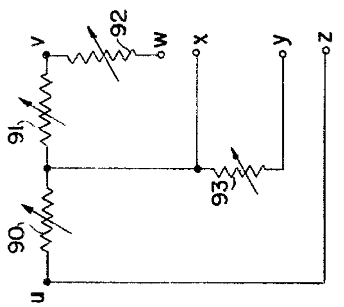
FIG. 3 illustrates a circuit arrangement which may be utilized in the circuit of FIG. 2 to enable feedback transformer errors to be compensated.

FIG. 3 illustrates an alternative feedback divider arrangement which may be utilized in place of the variable resistances 66 and 68 in FIG. 2. The network in FIG. 3 includes variable resistances 90, 91, 92 and 93. The terminals of the network shown in FIG. 3 are denoted by letters *u*, *v*, *w*, *x*, *y* and *z*. These letters correspond to the similar letters appearing in FIG. 2, and serve to illustrate how the network of FIG. 3 may be interconnected in the circuit of FIG. 2. The variable resistors 90 and 91 are connected between the input terminal 13 and the terminal 23 of the modulator 3. The variable resistance 92 is connected from the input terminal 23 of the modulator 3 through the secondary 71 of the transformer 69 to the variable resistance 93 and to the junction between the variable resistances 90 and 91. The line 95 in FIG. 2 between points *x* and *y* is omitted and the inductance 44 may be omitted when the circuit of FIG. 3 is used. The variable resistance 93 is connected to the terminal 85 of the demodulator 84, and the terminal 86 of the demodulator 84 is connected to the input terminal 13. The resistors 91 and 92 preferably are high frequency response resistors. The resistors 90 and 93 preferably are very high precision wire wound resistances. With the arrangement of the variable resistances shown in FIG. 3, adjustments may be made by varying these resistances to compensate for errors in the transformers 69 and 81. It is obvious that other networks readily will suggest themselves. For example, in FIG. 3 the terminals *x* and *y* could be tied together (omitting the resistance 93) and a variable resistance included between the terminals *u* and *z*.

According to an additional feature of this invention, more than one fast forward and/or fast feedback channel may be provided if desired. Additional transformers for passing very fast signals may be added in series with the fast transformers in FIGS. 1 and 2. For example, two or more transformers could be used in place of each of transformers 8 and 69 in respective FIGS. 1 and 2. Feedback series cross-over networks (such as a capacitor or capacitors) may then be used to divide the fast signals between the fast transformers, one of the fast transformers handling higher frequencies than the other. Furthermore, a resistance may be connected across each feedback path (across the fast transformer or across each fast transformer, and across terminals *y* and *z*) with each of these resistances being connected in series across a potential divider such as resistances 66 and 68 in FIG. 2. Although an amplifier is discussed as being used in the slow feedback path in FIG. 2, such amplifier may be omitted if desired.

Figure 4:
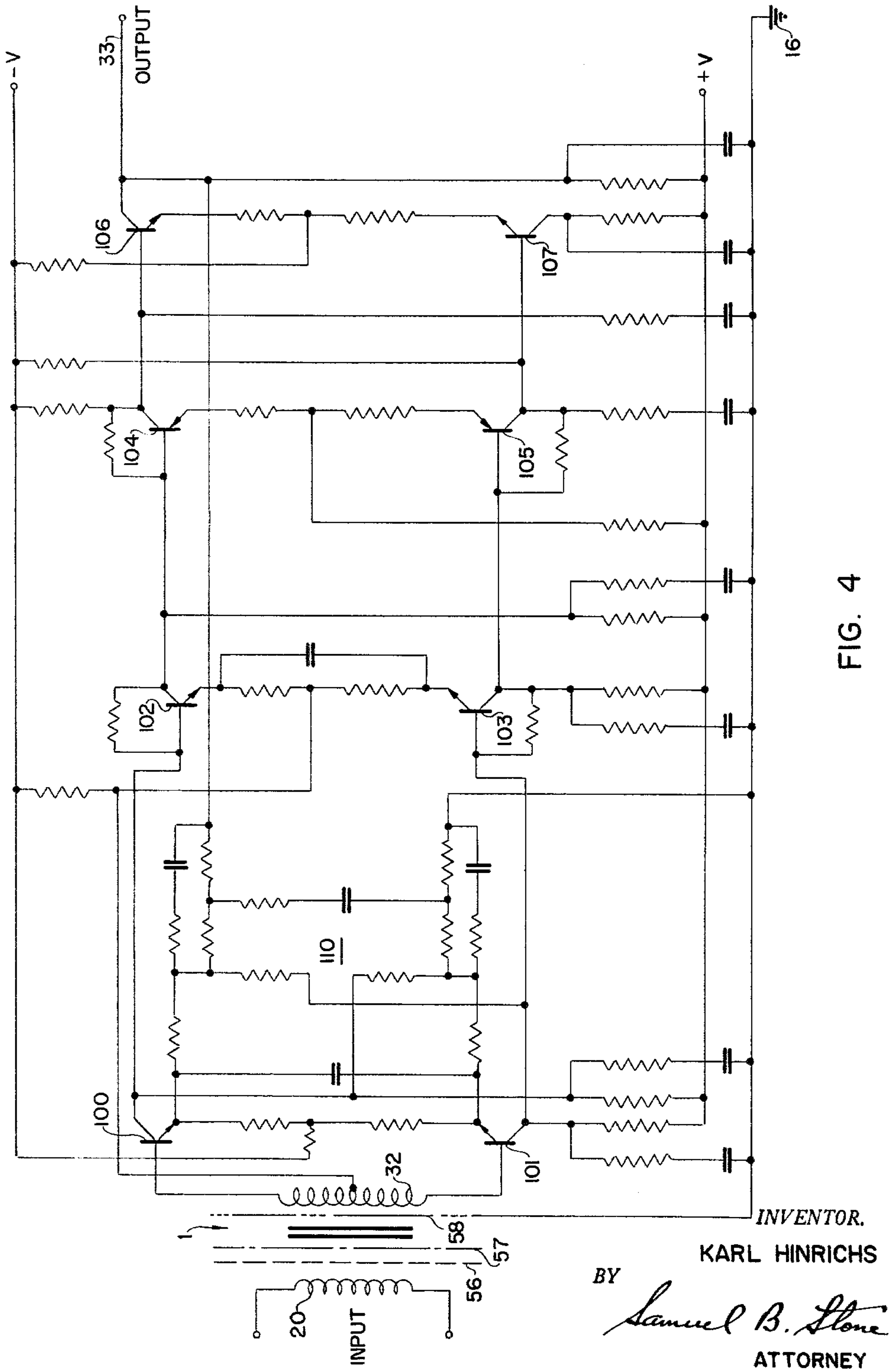
FIG. 4 is a schematic diagram of the fast amplifier shown in block form in FIGS. 1 and 2.

FIG. 4 illustrates a voltage amplifier which may be employed as the fast amplifier 2 shown in block form in FIGS. 1 and 2. This amplifier amplifies the fast, or upper frequency, error signals. The secondary winding 32 of the transformer 1 is connected to a differential input stage including NPN transistors 100 and 101. The collectors of the transistors 100 and 101 are connected to the bases of respective NPN transistors 102 and 103. In a like manner, the collectors of the transistors 102 and 103 are connected to the respective bases of PNP transistors 104 and 105. The collectors of the transistors 104 and 105 are connected to the respective bases of NPN transistors 106 and 107. The transistors 102 through 107 provide voltage gain in a manner well known in the art. The output of the fast amplifier is provided on the output line 33 (between the line 33 and ground 16). A feedback gain band-pass network 110 is provided for the fast amplifier and is connected from the output terminal 33 and ground 16 to the collectors and emitters of the transistors 100 and 101. As noted previously, the fast amplifier provides amplification of the fast error signal in the range from a few cycles per second to above 100,000 cycles per second.

Figure 5:
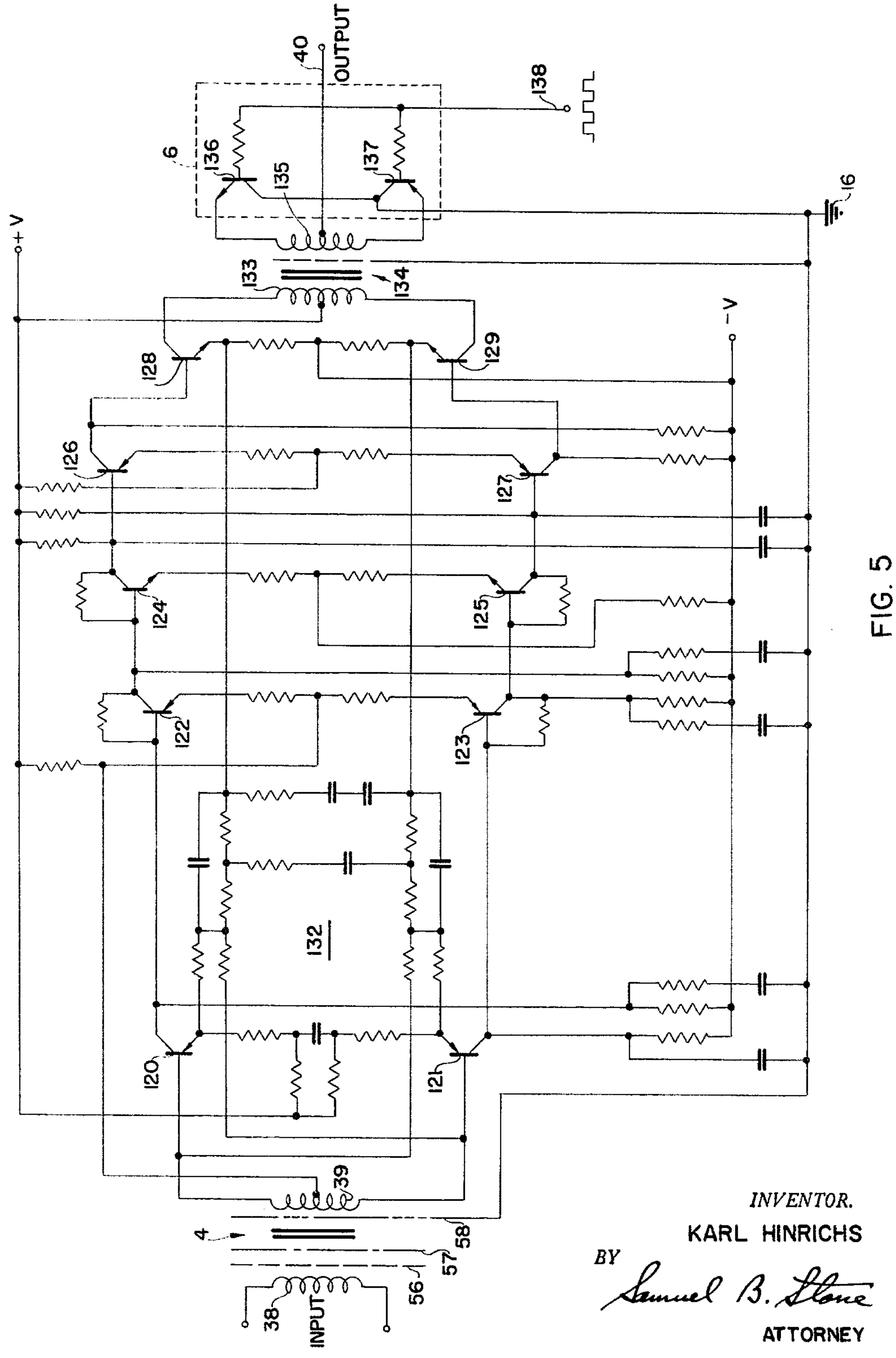
FIG. 5 is a schematic diagram of the slow amplifier and forward demodulator illustrated in block form in FIGS. 1 and 2.

FIG. 5 illustrates in detail the slow amplifier 5 and the demodulator 6 shown in block form in FIGS. 1 and 2. This amplifier is a transconductance amplifier which provides a high impedance output, and provides a current output for a voltage input. The secondary winding 39 of the transformer 4 is connected to the bases of PNP transistors 120 and 121. The collectors of the transistors 120 and 121 are connected to the respective bases of PNP transistors 122 and 123. The transistors 120 through 123 provide a differential input which may be termed a "Squarved" differential input. The term "squarved" is well known in the art and is derived from a combination of the terms "starved" and "squashed." The term "squarved" refers to the manner in which the transistors are operated which is an ultra-low current and ultra-low voltage operation. This type of operation provides exceptionally low noise.

The collectors of the transistors 122 and 123 are connected to the respective bases of NPN transistors 124 and 125. The collectors of the transistors 124 and 125 are connected to the respective bases of PNP transistors 126 and 127. The transistors 124 through 127 provide gain. The collectors of the transistors 126 and 127 are connected to the bases of output driver NPN transistors 128 and 129. The emitters of the output driver transistors 128 and 129 are connected to a feedback gain band-pass network 132 which in turn is connected to the bases and the emitters of the transistors 120 and 121.

The collectors of the transistors 128 and 129 are connected to a primary winding 133 of a transformer 134. A secondary winding 135 of the transformer 134 is connected to an NPN transistor 136 and a PNP transistor 137 in the demodulator 6. The collectors of the transistors 136 and 137 are connected together and to ground 16. A keying drive for the demodulator 6 is provided through a line 138. This keying drive is of the same frequency as that applied to the modulator 3 and may be, for example, a 400 cycle square wave. This drive is applied to the bases of the transistors 136 and 137 in the demodulator 6 to cause the transistors to conduct alternately. The output of the demodulator 6 is derived on the output line 40 (between the line 40 and ground 16) which is connected to a center tap on the secondary winding 135 of the transformer 134. As noted previously, the slow amplifier shown in FIG. 5 provides amplification for the slow error signals in the range of D.C. to a few cycles per second.

Figure 6:
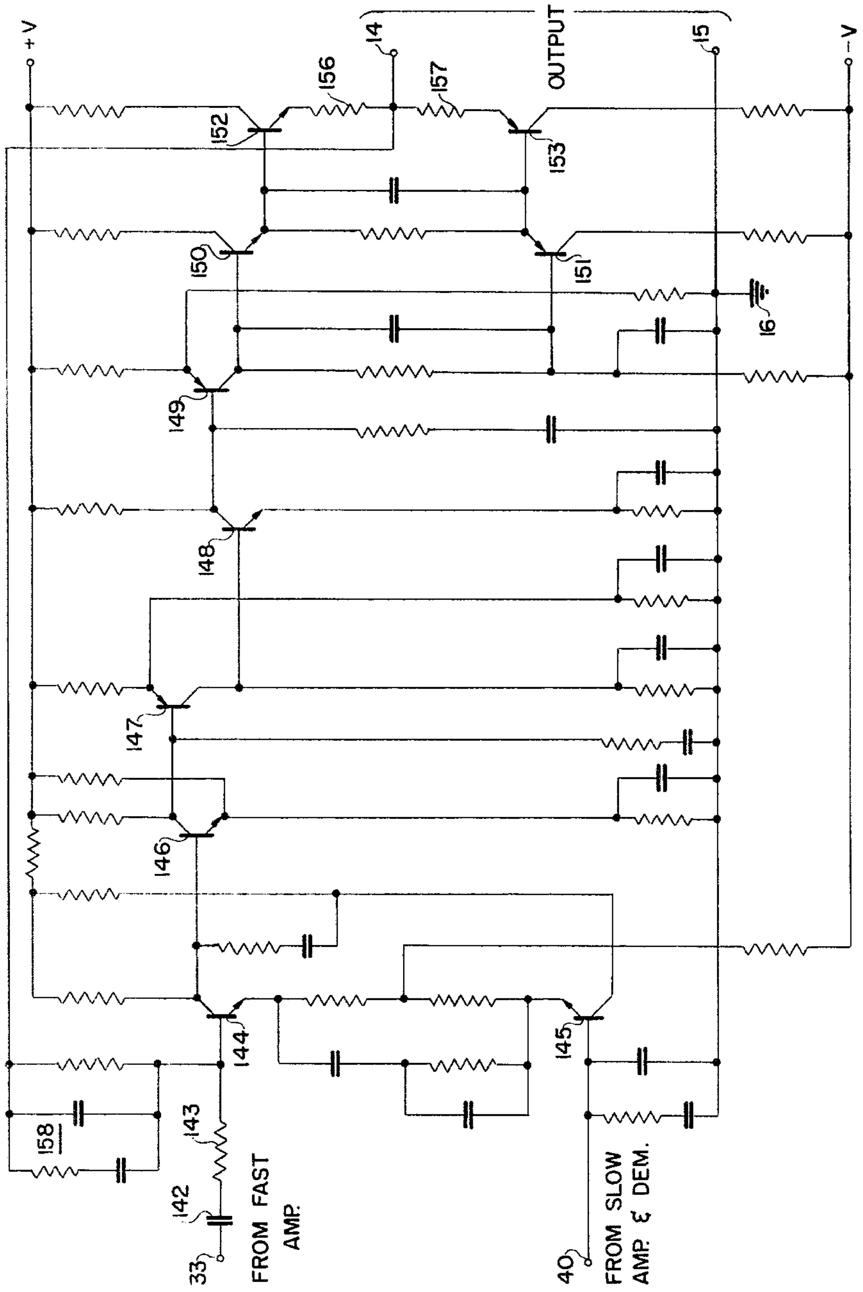
FIG. 6 is a schematic diagram of the mixer amplifier shown in block form in FIGS. 1 and 2.

The mixer amplifier 7 shown in block form in FIGS. 1 and 2 is illustrated in detail in FIG. 6. This amplifier serves to mix the outputs from the fast amplifier 2 and the demodulated output of the slow amplifier 5. The output from the fast amplifier 2 is connected through the terminal 33, a coupling capacitor 142 and a resistance 143 to the base of an NPN transistor 144. The output from the demodulator 6 is connected to the terminal 40 which in turn is connected to the base of an NPN transistor 145. The transistors 144 and 145 comprise a differential input stage, and this stage is connected to the base of an NPN transistor 146. The collector of the transistor 146 is connected to the base of a PNP transistor 147. The collector of the transistor 147 is connected to the base of an NPN transistor 148, and the collector of the transistor 148 is connected to the base of a PNP transistor 149. The transistors 146 through 149 provide gain, and the stage including the transistor 149 is connected to complementary transistors 150 and 151 which serve as output drivers. The transistors 150 and 151 are connected to an output power stage including complementary transistors 152 and 153. The emitter of the transistor 152 is connected through a resistance 156 to the output terminal 14, and the emitter of the transistor 153 is connected through a resistance 157 to the terminal 14. A feedback network 158 is connected from the output 14 to the base of the transistor 144. The mixer amplifier illustrated in FIG. 6 provides voltage gain and impedance conversion thereby to provide power gain. The output of the mixer amplifier, and consequently the output of the entire wide-band amplifier, is derived from the terminals 14 and 15 as explained previously.

Figure 7:
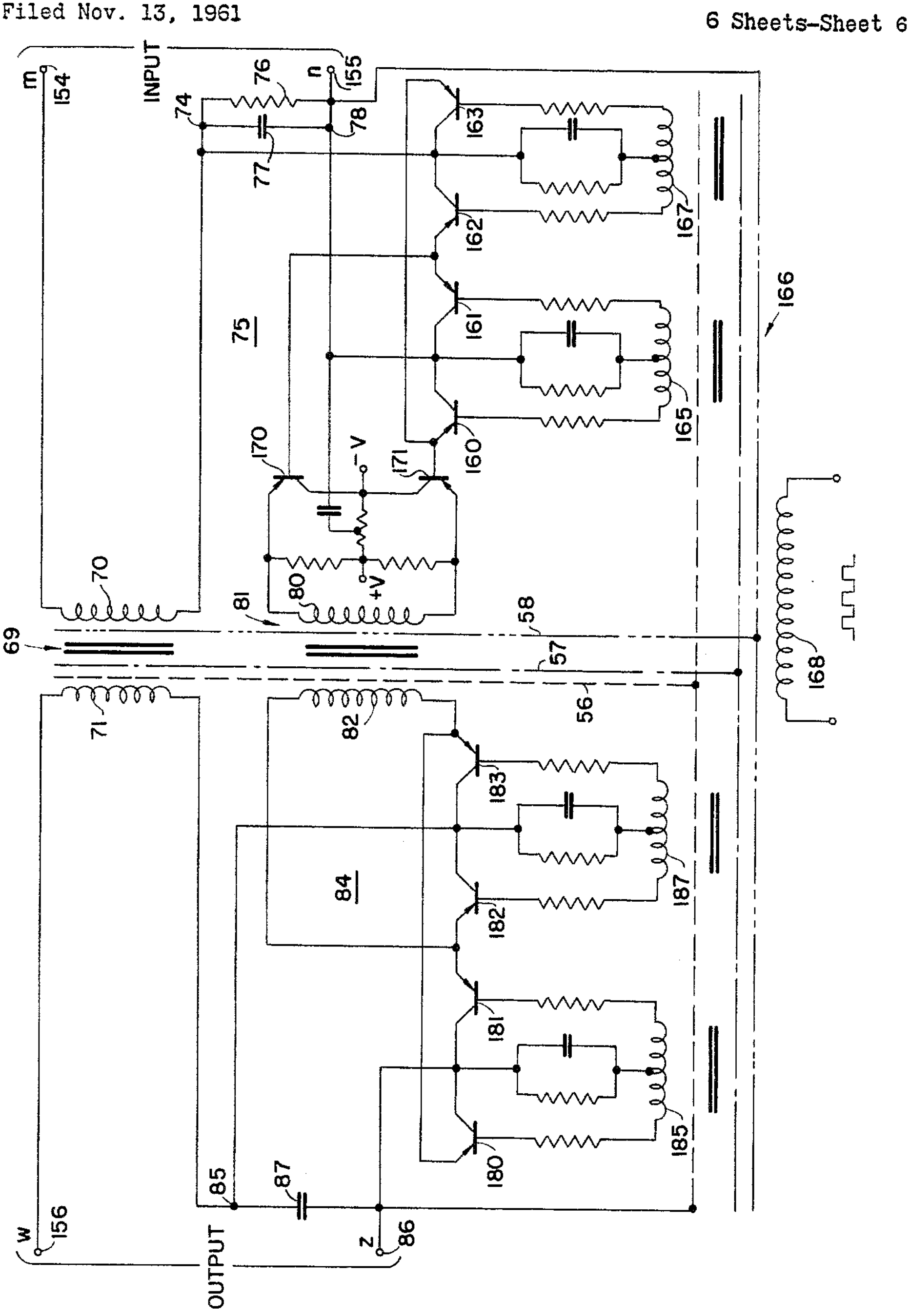
FIG. 7 is a detailed schematic diagram of the feedback isolator shown in FIG. 2.

FIG. 7 illustrates in detail the feedback isolator shown in schematic and block form in FIG. 2. Where corresponding parts are shown in FIGS. 2 and 7 like reference numerals are utilized. The output from the mixer amplifier 7 in FIG. 2 is applied to input terminals 154 and 155 (also respectively labeled *m* and *n*) of the feedback isolator shown in FIG. 7. The output from the feedback isolator is taken from terminals 156 and 86 (also labeled respectively *w* and *z*). The feedback isolator utilizes serially crossed-over paths or links on both the input and output sides of the isolator to obtain a wide pass band. The first link includes the transformer 69 which may pass the fast feedback signals in the range of approximately 50 cycles per second to above 100 kilocycles per second. The upper frequency limit in the feedback circuit normally is lower than the upper frequency limit in the forward channel to prevent oscillation.

The second track or slow feedback path consists of a symmetrical modulator and demodulator 75 and 84, respectively, which operate, for example, at a carrier frequency of 28 kilocycles. This path may carry signals from D.C. to around 50 cycles per second. In discussing a particular cross-over frequency it is to be understood that this is exemplary only and that the roll-off need not be sharp as was discussed previously. The modulator is a conventional transistorized modulator and includes transistors 160 through 163. A secondary winding 165 of a transformer 166 is coupled to the bases of the transistors 160 and 161, and a secondary winding 167 is coupled to the bases of the transistors 162 and 163. A keying drive, for example a 28 kilocycle square wave, is applied to a primary winding 168 of the transformer 166 to key the transistors 160 through 163. The output of the modulator is applied to transistors 170 and 171 connected in an emitter-follower configuration. The emitter followers 170 and 171 provide power gain. They serve to unload the input circuit of the isolator from driving the capacitances following the modulator. Any precision amplifier can serve this function. These emitter followers 170 and 171 provide a high input impedance and prevent a high energy drain out of the input circuit without introducing gain error. The emitter followers 170 and 171 are connected to the primary winding 80 of the transformer 81, the secondary winding 82 of which is connected to the demodulator 84. The demodulator 84 is a conventional transistor demodulator and includes transistors 180 through 183. A secondary winding 185 of the transformer 166 is connected to the bases of the transistors 180 and 181 to apply keying signals thereto. In a like manner a secondary winding 187 of the transformer 166 is connected to the bases of the transistors 182 and 183. The output of the demodulator 84 is connected across the terminals 85 and 86.

As noted previously, the feedback voltages are applied across the terminals 154 and 155 of the feedback isolator in FIG. 7. The higher frequency components of the voltages are applied through the transformer 69 to the output terminal 156 and the terminal 85. The lower frequency voltages are modulated in a conventional manner and applied to the emitter followers 170 and 171. The emitter followers 170 and 171 amplify the modulated slow feedback voltages and apply them through the transformer 81 to the demodulator 84. The demodulator 84 in turn demodulates the slow feedback voltages and applies them across the output terminal 86 and the terminal 85 in additive relationship with the fast feedback voltages. Hence, the feedback voltages in the range of D.C. to 100 kilocycles per second, or above, are available across the output terminals 156 and 86 of the feedback isolator.

It now should be apparent that wide-band low pass amplifiers having complete conductive and electrostatic isolation of the input from the output thereof are provided by the present invention. In addition to conductive and electrostatic isolation and wide-band low pass operation, the amplifiers of the present invention are characterized by high common mode rejection, high accuracy and high linearity. This is accomplished by isolating the input from the output with transformers and, by providing separate forward and feedback channels, the feedback channel having serially crossed-over paths for slow and fast signals.

Although particular components, frequencies of operation and frequency ranges have been discussed in connection with specific examples of circuits constructed in accordance with the present invention, others may be utilized. Furthermore, it will be understood that although exemplary embodiments of the present invention have been disclosed and discussed, other applications and circuit arrangements are possible and that the embodiments disclosed may be subjected to various changes, modifications and substitutions without necessarily departing from the spirit of the invention.

What is claimed is:

1. A wide-band amplifier comprising a forward channel means and a feedback channel means; said forward channel means including a first transformer means and fast amplifier means connected in series output to input respectively for transferring fast voltages to a mixer amplifier, and first modulator means, second transformer means, slow amplifier means and first demodulator means connected in series output to input respectively for transferring slow voltages to said mixer amplifier; an input circuit including the inputs of said first transformer means and said first modulator means connected in series, the output of said feedback channel means being connected to feed back into said input circuit; output terminals connected to said mixer amplifier and to the input of said feedback channel means; and said feedback channel means comprising serially crossed-over paths including a third transformer means for transferring fast feedback voltages to said input circuit, and a second modulator means, a fourth transformer means and a second demodulator means connected in series output to input respectively for transferring slow feedback voltages from said output to said input circuit, and potential divider impedance means connected in said feedback channel for adjusting the gain of said wide-band amplifier said divider including one portion connected across the input of said feedback channel means and another portion connected in series with the input circuit of said feedback channel means.

2. A wide-band amplifier comprising a forward channel means and a feedback channel means; said forward channel means including a first transformer means and fast amplifier means connected in series output to input respectively for transferring fast signals to a mixer amplifier, and first modulator means, second transformer means, slow amplifier means and first demodulator means connected in series output to input respectively for transferring slow signals to said mixer amplifier; an input circuit including the inputs of said first transformer means and said first modulator means connected in series, the output of said feedback channel means being connected to feed back into said input circuit; output terminals connected to said mixer amplifier and to the input of said feedback channel means; and said feedback channel means including third transformer means including at least one transformer having a primary winding and a secondary winding for transferring fast feedback signals to said input circuit, and a second modulator means, a fourth transformer means and a second demodulator means connected in series output to input respectively for transferring slow feedback signals to the input of said input circuit, said second modulator means being serially connected with at least said primary winding of said third transformer means, and the output of said second demodulator means being serially connected with at least said secondary winding of said third transformer means.

3. A wide-band amplifier as in claim 2 wherein at least said first and said second modulators and said second demodulator are choppers, and said impedance means includes a divider connected with said output circuit.

4. A wide-band amplifier as in claim 2 wherein a divider is connected across the series circuit comprising the output of said second demodulator means and said secondary winding and a portion of said divider is connected in series with said input circuit.

5. A wide-band amplifier as in claim 4 wherein said first modulator means is a chopper, and said first demodulator means, said second demodulator means and said second modulator means each includes solid-state components.

6. A wide-band amplifier comprising a first transformer having a primary winding and a secondary winding; an input circuit means which includes the primary winding of the first transformer and the input of a modulator means and the output of a feedback circuit means connected in series; the secondary winding of said first transformer being connected to a first amplifier; the output of said first modulator being connected through a second transformer, a second amplifier and a first demodulator in series to a third amplifier; the output of said first amplifier being connected to the input of said third amplifier; said feedback circuit means having an input connected with the output of said third amplifier; a third transformer having a primary winding and a secondary winding; the input of said feedback circuit means including the primary winding of the third transformer and the input of a second modulator means connected in series; said output of said feedback circuit means including the secondary winding of said third transformer and the output of a second demodulator means connected in series; a fourth transformer coupling the output of said second modulator with the input of said second demodulator; and said feedback circuit means including impedance means connected therein for adjusting the gain of said wide-band amplifier.

7. A wide-band amplifier as in claim 6 wherein said impedance means includes a divider connected with the input of said feedback circuit means.

8. A wide-band amplifier as in claim 6 wherein said impedance means includes a divider connected with the output of said feedback circuit means, a portion of said divider being connected in said input circuit.

9. A device for transferring signals applied to the input terminals thereof to output terminals thereof while maintaining conductive and electrostatic isolation between said input terminals and said output terminals comprising a first circuit means connected with said input terminals for receiving said input signals and for receiving additional signals for providing error signals, first channel means for transferring said error signals to said output terminals, second channel means connected with said output terminals and with said first circuit means while maintaining conductive and electrostatic isolation between said output terminals and said first circuit means, said second channel means including first transfer means for transferring low frequency signals from the input to the output of said second channel means, said second channel means further including second transfer means for transferring signals of a relatively higher frequency than said low frequency signals from the input to the output of said second channel means, and said first and second transfer means having serially interconnected input means and serially interconnected output means, said input means in both transfer means being conductively isolated from said output means through transformers.

10. A wide-band low pass amplifier comprising a forward channel means and a feedback channel means; said forward channel means including input terminals adapted to receive voltages to be amplified by said wide-band amplifier, a first transformer having a primary winding and a secondary winding, a first impedance means, and a variable impedance means; a first circuit means interconnecting said input terminals including said primary winding, said first impedance means and said variable impedance means connected in series; a first modulator having an input connected across said first impedance means, a second transformer having a primary winding and a secondary winding, the output of said modulator being connected with the primary winding of said second transformer; and a first amplifier having an input connected with the secondary winding of said first transformer, a second amplifier having an input connected with the secondary winding of said second transformer, a first demodulator, a third amplifier, the output of said first amplifier being connected to said third amplifier, the output of said second amplifier being connected to the input of said first demodulator, the output of said first demodulator being connected to the input of said third amplifier, and said third amplifier being connected with output terminals of said wide-band amplifier: and said feedback channel means including input terminals connected with the output terminals of said wide-band amplifier and output terminals connected across said variable impedance means; a third transformer including a primary winding and a secondary winding, and a second impedance means; a second circuit means connecting the primary winding of said third transformer and said second impedance means in series with the input terminals of said feedback channel means; a second modulator means having an input connected across said second impedance means, a fourth transformer including a primary winding and a secondary winding, the output of said second modulator means being connected with the primary winding of said fourth transformer; a third impedance means, a second demodulator having an output connected across said third impedance means, said second demodulator having an input connected with the secondary of said fourth transformer; and a third circuit means connecting the secondary of said third transformer and said third impedance means in series with said variable impedance means.

11. An amplifier having an input and output which are conductively isolated from one another including a first transfer means for transferring electrical signals having an upper range of frequencies from said input to said output, a second transfer means for transferring electrical signals having a lower range of frequencies from said input to said output, a feedback means having an input conductively isolated from the output thereof, the input of said feedback means being conductively coupled to the output of said amplifier, the output of said feedback means being conductively coupled with the input of said amplifier, said feedback means including a third transfer means for transferring electrical signals having an upper range of frequencies, said feedback means including a fourth transfer means for transferring electrical signals having a lower range of frequencies, the inputs of said third and fourth transfer means being conductively interconnected, and the outputs of said third and fourth transfer means being conductively interconnected.

12. An amplifier as in claim 11 wherein said third transfer means includes at least one transformer for transferring electrical signals having an upper range of frequencies, and said feedback means includes a divider for adjusting the gain of the amplifier.

13. An amplifier as in claim 11 wherein the upper and lower range of frequencies transferred by said first and said second transfer means may be different from the upper and lower range of frequencies transferred by said third and fourth transfer means, and said lower range of frequencies transferred by said second and said fourth transfer means includes D.C.

14. The wide-band amplifier of claim 1 in which said potential divider includes one portion connected across the output of said feedback channel means and another portion connected in series with the output of said feedback channel means.

References Cited by the Examiner

UNITED STATES PATENTS

| | | | |
|---|---|---|---|
| 2,255,190 | 9/1941 | Ryall | 330—84 X |
| 2,285,164 | 6/1942 | Kummerer | 330—151 X |
| 2,638,501 | 5/1953 | Coleman | 330—151 |
| 2,752,433 | 6/1956 | White et al. | 330—103 |
| 2,771,518 | 11/1956 | Sziklai | 330—84 |
| 2,961,614 | 11/1960 | Neff | 330—151 |
| 3,101,451 | 8/1963 | Burgarella et al. | 330—9 X |

ROY LAKE, *Primary Examiner.*

NATHAN KAUFMAN, *Examiner.*